United States Patent
Ishizaki et al.

(10) Patent No.: US 7,553,381 B2
(45) Date of Patent: Jun. 30, 2009

(54) CRYSTALLINE METAL FILM

(75) Inventors: Akemi Ishizaki, Yokohama (JP); Isao Kimura, Kawasaki (JP); Mitsuru Otsuka, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 11/834,983

(22) Filed: Aug. 7, 2007

(65) Prior Publication Data

US 2008/0038147 A1 Feb. 14, 2008

(30) Foreign Application Priority Data

Aug. 11, 2006 (JP) ............................. 2006-219168
Jun. 22, 2007 (JP) ............................. 2007-165231

(51) Int. Cl.
B32B 15/04 (2006.01)
C22C 27/02 (2006.01)
C22C 27/04 (2006.01)

(52) U.S. Cl. ...................... 148/422; 420/427; 420/428; 420/429; 420/430; 428/209; 428/544; 148/423

(58) Field of Classification Search ......... 420/427–430; 427/250–253; 428/209, 332, 334–336, 544, 428/686; 148/400, 422, 423

See application file for complete search history.

(56) References Cited

U.S. PATENT DOCUMENTS 4,192,695 A * 3/1980 Mahalla .................. 148/404
6,374,482 B1 4/2002 Mihara et al. ............ 29/611
6,834,943 B2 12/2004 Ogawa et al. ............ 347/65

FOREIGN PATENT DOCUMENTS

JP 11-48488 A 2/1999

OTHER PUBLICATIONS

Muto, H., et al., "The Large-Scale Deformation of Polycrystalline Aggregates: Cooperative Grain-Boundary Sliding", Acta mater., vol. 48 (2000), 4161-4167.
Lim, J., et al., "Effect of Substrate Bias Voltage on the Thermal Stability of Cu/Ta/Si Structures Deposited by Ion Beam Deposition", Jpn. J. Appl. Phys., vol. 42 (2003), pp. 2780-2785.
Hoogeveen, R., et al., "Texture and phase transformation of sputter-deposited metastable Ta films and Ta/Cu multilayers", Thin Solid Films 275 (1996), pp. 203-206.

* cited by examiner

Primary Examiner—Roy King
Assistant Examiner—Brian Walck
(74) Attorney, Agent, or Firm—Fitzpatrick, Cella, Harper & Scinto

(57) ABSTRACT

A metal film according to the present invention has a cubic crystal structure having a periodic pattern of crystal orientation in a plane. The crystal orientation is gradually rotated about a particular crystal-axis direction such that a {100} plane, a {110} plane, and a {111} plane appear.

5 Claims, 10 Drawing Sheets

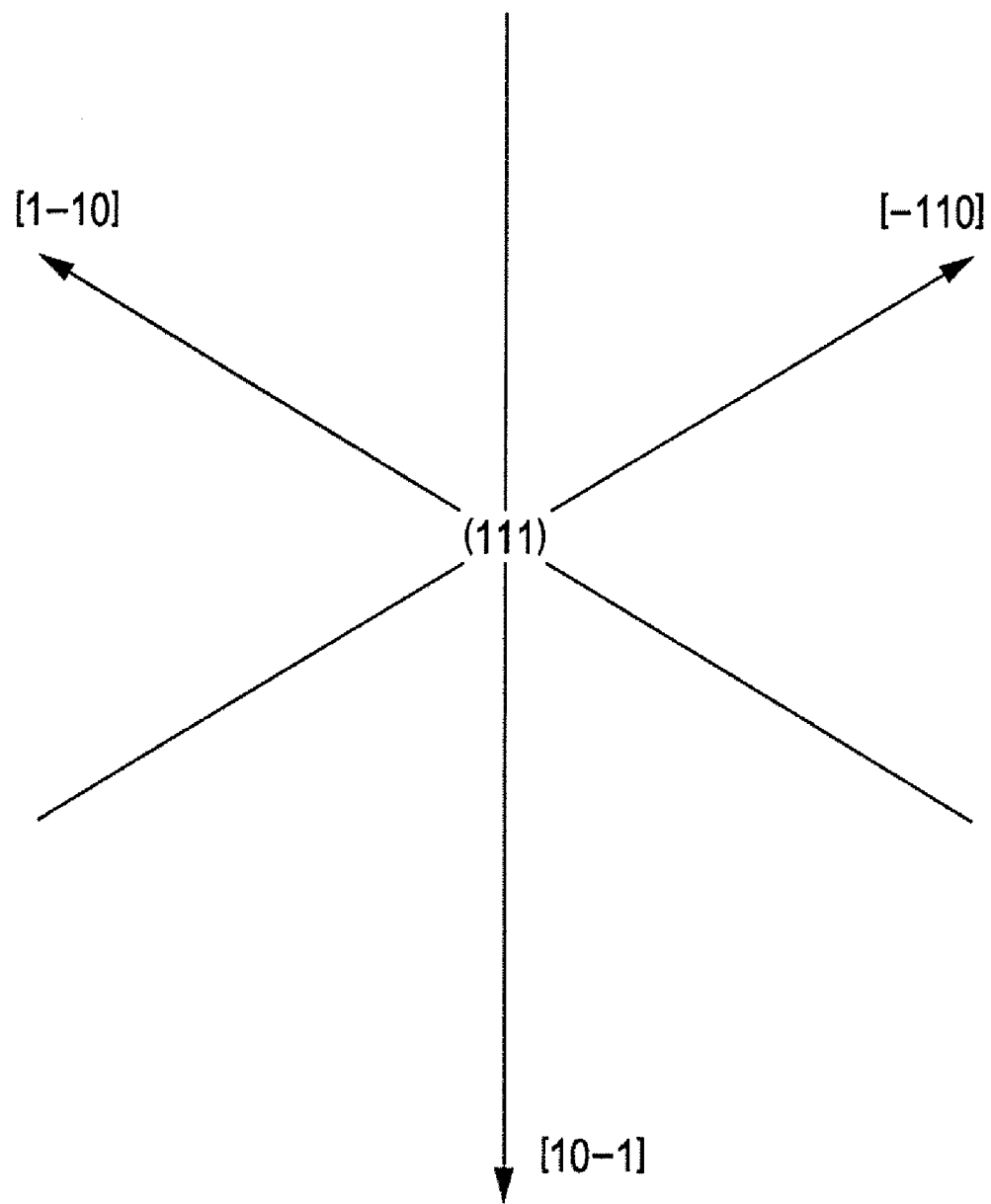

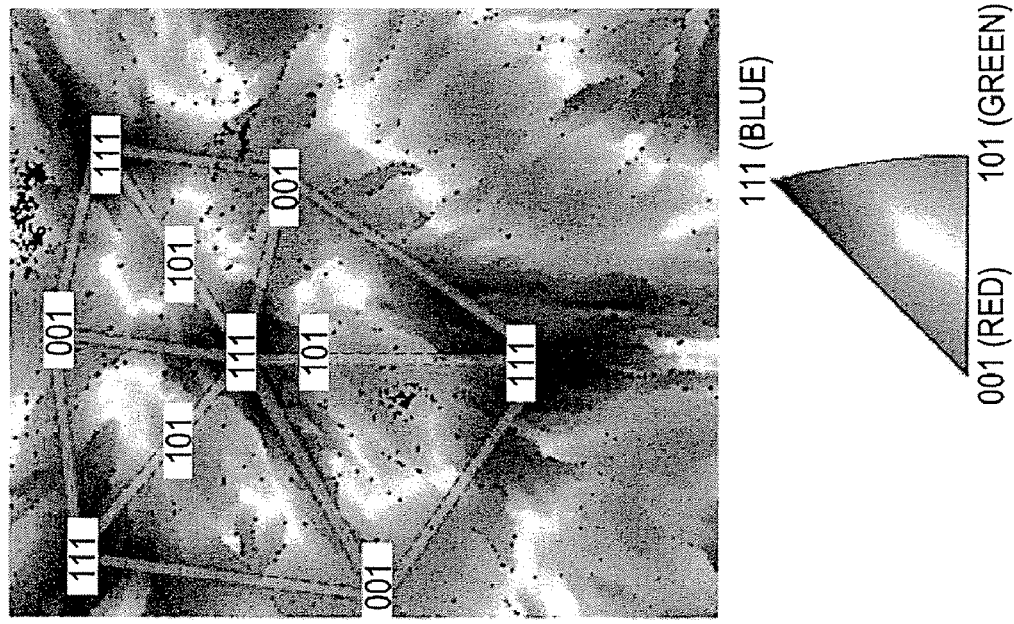
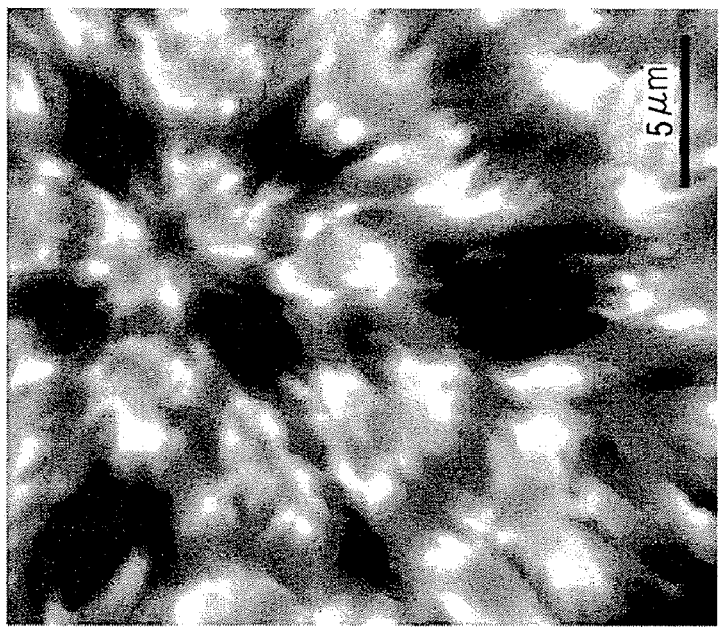

CRYSTALLINE METAL FILM

BACKGROUND OF THE INVENTION

1. Field of the Invention

The present invention relates to crystalline metal films.

2. Description of the Related Art

A variety of thin-film formation techniques, including chemical, physical, and combined techniques, have been used in a wide range of industrial fields such as semiconductor materials and magnetic materials.

Thin films can be generally divided into polycrystalline thin films, single-crystal thin films, and amorphous thin films. The most commonly formed thin films of these are polycrystalline thin films, which can be oriented or unoriented, depending on, for example, deposition conditions. An unoriented polycrystalline thin film includes crystal grains randomly oriented so that the orientations thereof are evenly distributed in all directions. An oriented polycrystalline thin film, on the other hand, has the tendency that a particular crystal axis is preferentially aligned in a particular direction.

Crystal structures of thin films can vary depending on, for example, the type of substrate on which the films are formed and temperature conditions. Accordingly, thin films are formed under various conditions selected according to target physical properties.

According to R. Hoogeveen, M. Moske, et al., Thin Solid Films 275 (1996) 203-206, for example, a tetragonal crystal system of tantalum, namely, β-tantalum, is formed if tantalum is deposited on a substrate such as a $SiO_2$ substrate or a BeO substrate, and a cubic crystal system of tantalum, namely, α-tantalum, is formed if tantalum is deposited on an aluminum substrate. According to this document, additionally, heat treatment up to 700° C. is required for substantially complete phase transition from β-tantalum to α-tantalum.

SUMMARY OF THE INVENTION

The present invention provides a metal film having better physical properties than known metal films.

A metal film according to the present invention has a cubic crystal structure. The metal film has a periodic pattern of crystal orientation in a plane. The crystal orientation is gradually rotated about a particular crystal-axis direction such that a {100} plane, a {110} plane, and a {111} plane appear.

The metal film according to the present invention has a regular orientation distribution that is not found in known polycrystalline thin films and can provide better physical properties than known metal thin films.

Further features of the present invention will become apparent from the following description of exemplary embodiments with reference to the attached drawings.

BRIEF DESCRIPTION OF THE DRAWINGS

FIG. 5 is a diagram for illustrating a mechanism by which the crystal structure according to the present invention is formed.

FIGS. 9A and 9B are photographs of an SIM image and an electron backscattering pattern (EBSP) image.

DESCRIPTION OF THE EMBODIMENTS

The inventors have studied methods for forming tantalum thin films and, as a result, have succeeded in forming a tantalum thin film with higher heat resistance and stability than known tantalum thin films. According to analysis, the tantalum thin film was determined to be α-tantalum.

A tantalum film formed on a $SiO_2$ substrate has a β-tantalum crystal structure. Conventionally, heat treatment at high temperature, namely, 700° C., is required to transform the β-tantalum crystal structure to α-tantalum. The inventors have achieved a method for forming an α-tantalum thin film without such heat treatment.

According to further analysis, the tantalum thin film was determined to have a unique structure with a periodic pattern in a plane. To date, there has been no report of such a crystal form as far as the inventors know; this is a unique crystal form first discovered by the inventors.

A detailed description will now be given of the unique periodic crystal structure according to the present invention, and of a method for forming such a tantalum thin film which triggered the discovery of the crystal structure.

FIGS. 2A to 2D illustrate an example of a method for forming an α-tantalum film having the unique periodic structure.

Figure 2A:
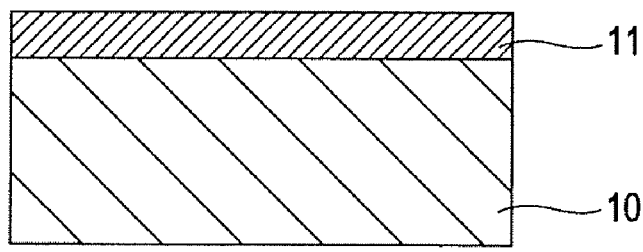
FIGS. 2A to 2D are diagrams illustrating a process for forming an α-tantalum film according to an embodiment of the present invention.
Figure 2B:
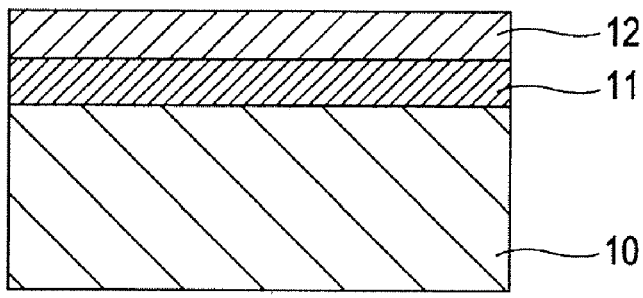
Figure 2C:
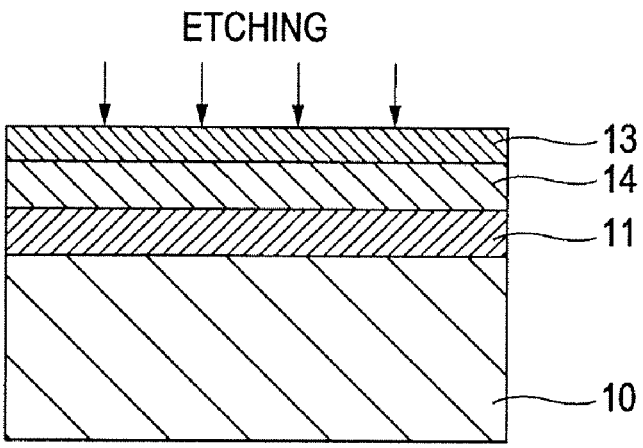
Figure 2D:
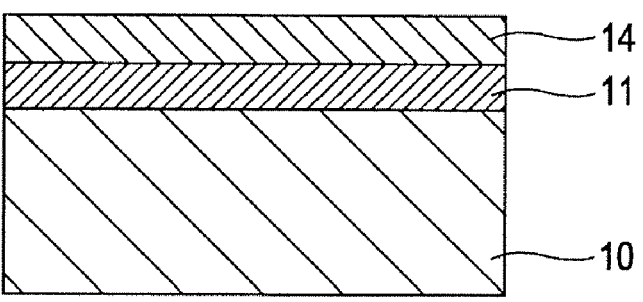

A silicon oxide film 11 is formed on a silicon substrate 10 by vapor deposition or thermal oxidation (in FIG. 2A). A β-tantalum film 12 is formed on the silicon oxide film 11 by, for example, vapor deposition (in FIG. 2B). A TiW film 13 is then formed (in FIG. 2C). Subsequently, the TiW film 13 is removed by etching (in FIGS. 2C and 2D).

The silicon oxide film 11 can be replaced with another substrate material on which a β-tantalum film is formed. Examples of such a material include silicon, beryllium oxide, and aluminum oxide (e.g., $Al_2O_3$).

The tantalum film thus formed has a β-tantalum structure when deposited on the silicon substrate 10. The β-tantalum structure is transformed to an α-tantalum structure after the TiW film 13 is deposited and then removed. This allows phase transition from a β-tantalum structure to an α-tantalum structure without a heat treatment as used in the related art.

Figure 1:
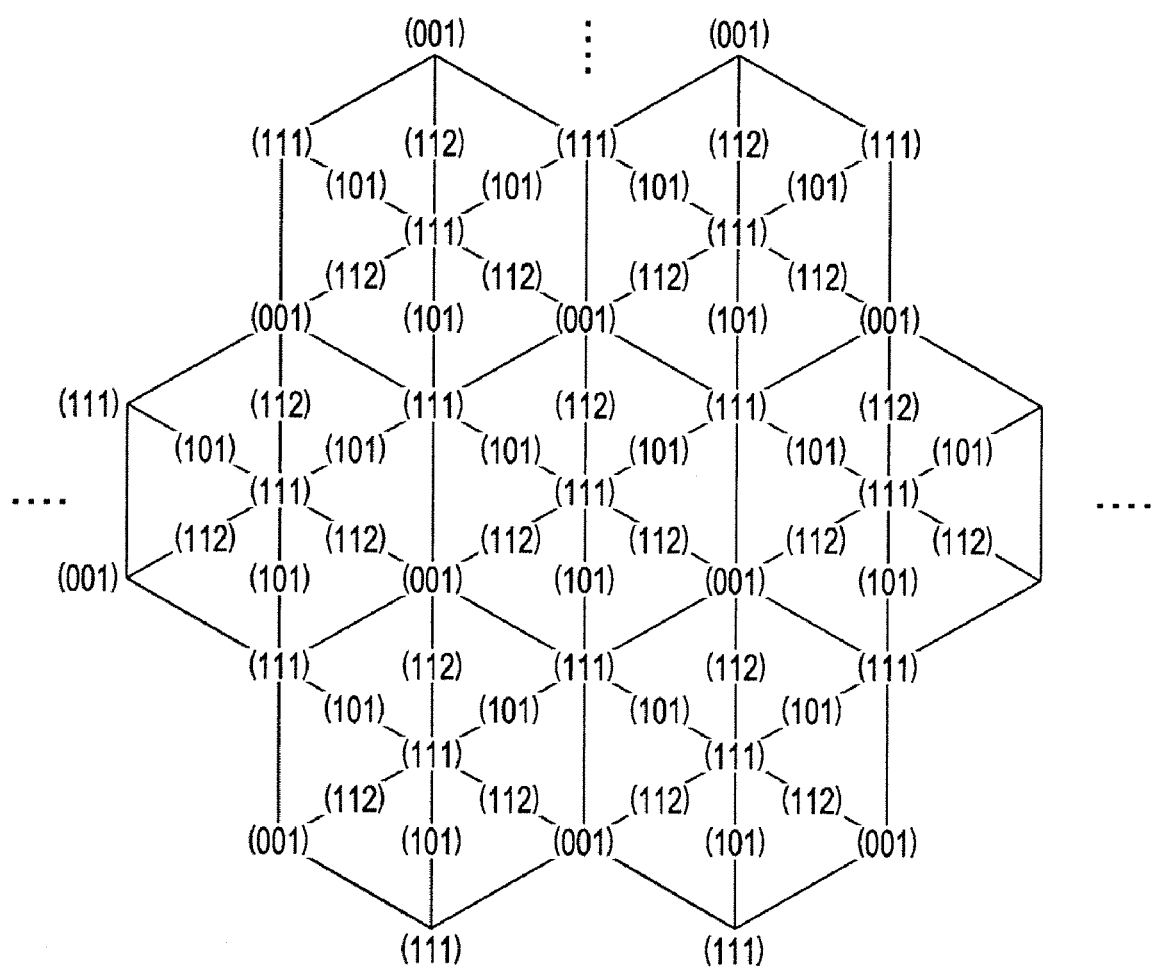
FIG. 1 is a schematic diagram of the present invention.
Figure 3:
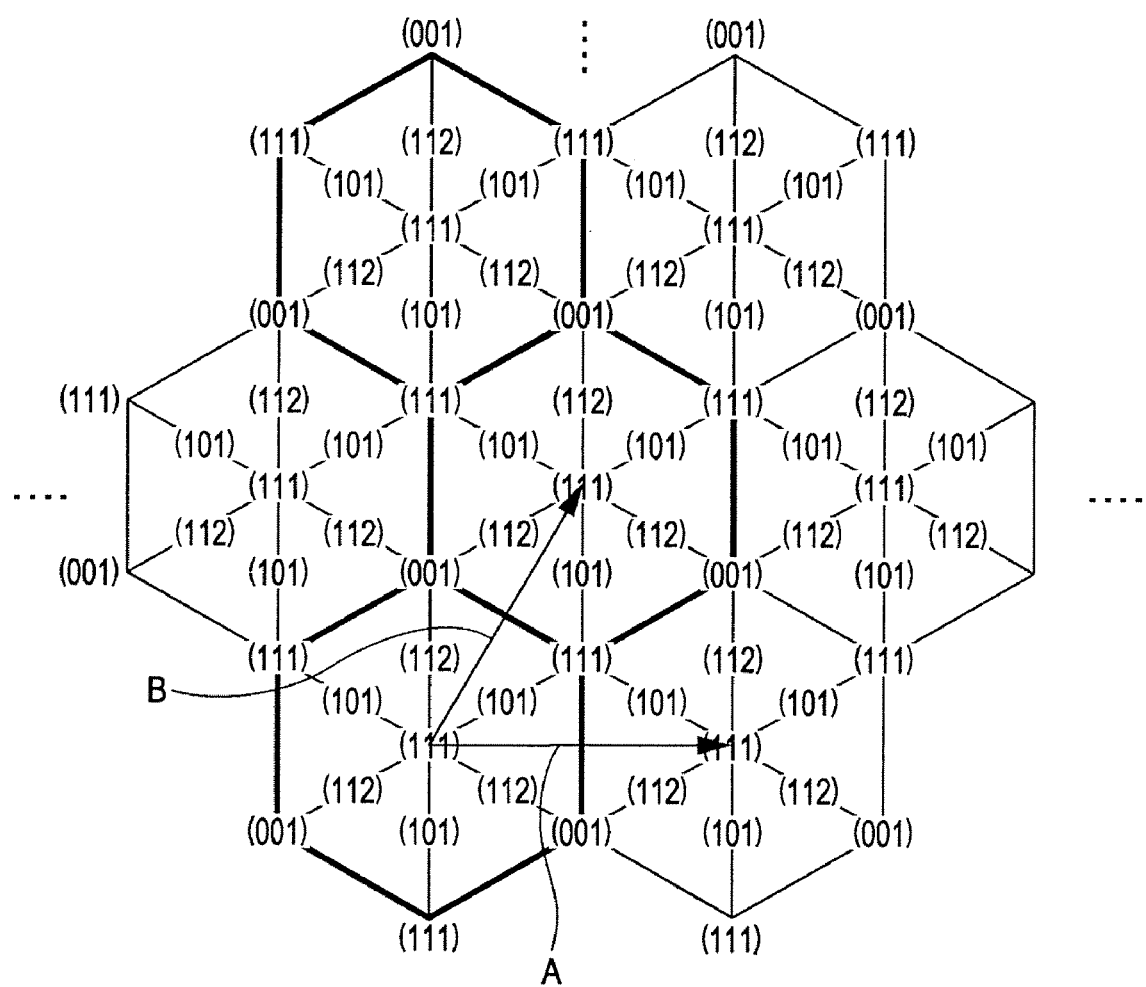
FIG. 3 is a schematic diagram of a periodic structure in the present invention.

FIG. 1 is a schematic diagram of a periodic orientation distribution structure of a metal film according to an embodiment of the present invention. In FIG. 1, the crystal planes of the metal film include the (001) plane, the (101) plane, and the (111) plane in terms of Miller indices. FIG. 3 is a diagram for illustrating that the metal film shown in FIG. 1 has a periodic pattern of crystal orientation. In FIG. 3, the structural unit of the periodic pattern can be considered to be a hexagon having three (001) planes and three (111) planes at its vertices. In FIG. 3, unit vectors A and B indicate the periodicity of the orientation distribution.

Figure 4:
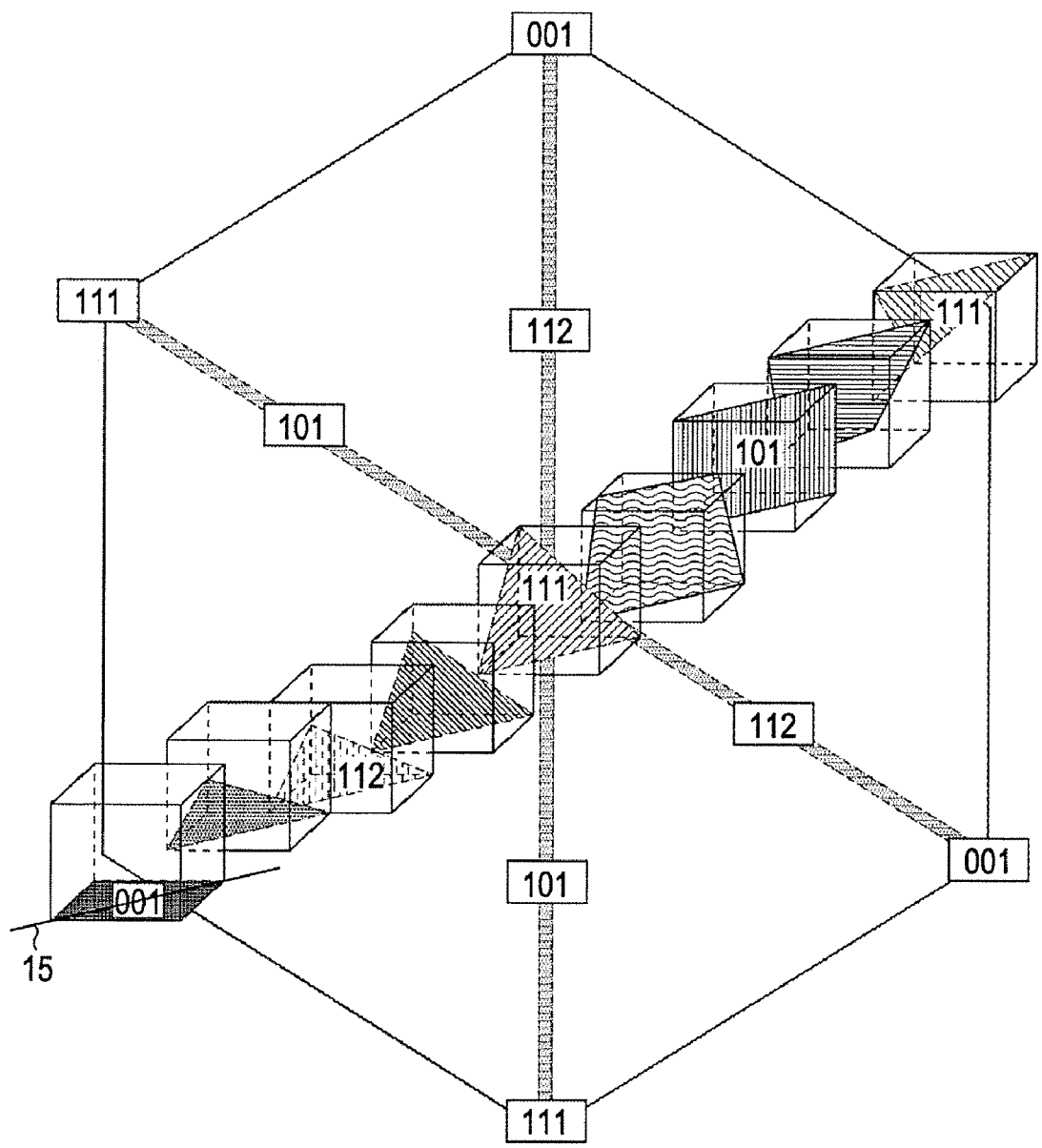
FIG. 4 is a schematic diagram illustrating changes of crystal orientation in the present invention.

FIG. 4 is an enlarged view of the hexagonal unit shown in FIG. 3, where individual lattice planes are illustrated with cubes representing space lattices. In FIG. 4, the metal film according to this embodiment has such an orientation distribution that the crystal orientation thereof is gradually rotated about a particular crystal-axis direction 15. The (001) plane changes to the (112) plane and then to the (111) plane with respect to the particular crystal-axis direction 15. The (111) plane in turn changes to the (101) plane and then back to the (111) plane. In a cubic crystal system, {100} planes include the (001) plane, {110} planes include the (101) plane, and {111} planes include the (111) plane.

In the periodic structure of the metal film according to this embodiment, as described above, the structural unit defined by the planes of the particular Miller indices is repeated in a plane. In addition, the crystal orientation represented by the particular Miller indices is gradually rotated about the particular crystal-axis direction 15. Each region having the periodic structure in a plane extends over a length of at least 10 µm, a length of at least 20 µm, or a length of at least 30 µm.

Although in general adjacent crystal grains of an unoriented polycrystalline film can have a particular orientation relationship, they cannot have an in-plane periodic orientation relationship over a length of at least 10 µm, a length of at least 20 µm, or a length of at least 30 µm as obtained in the present invention. Unlike the metal film according to this embodiment, an unoriented polycrystalline film ever known has random crystal orientation in a plane. Additionally, even an oriented polycrystalline film cannot have an in-plane periodic orientation relationship over a length of several tens of micrometers.

As described above, the metal film according to this embodiment has a unique structure in comparison with known polycrystalline films. FIG. 1, used in the above description, is merely illustrative of the crystal structure; actually, a deformed structure is observed, as shown in examples below.

The mechanism by which the regular orientation distribution film according to this embodiment is formed has not yet been clearly understood, although at present the inventors presume the mechanism to be as follows.

Stress on a thin film is affected by a lower interface with an underlying substrate and, if in contact with an overlying solid, is also affected by an upper interface with the solid. Hence, a change in such a direction as to relax the stress will be facilitated if the lower or upper interface develops any deformation or structural transformation mechanism capable of relaxing the stress in the thin film.

One of known stress relaxation mechanisms is cooperative grain boundary sliding, which is a mechanism describing large plastic deformation due to "sliding" of adjacent crystal grains at the boundaries thereof (H. MUTO, M. SAKAI, Acta Mater. 48 (2000)-4161).

If a single-crystal region with the (111) plane in a cubic crystal system is taken as a starting point, as shown in FIG. 5, three equivalent <110> directions are found every about 120° in the (111) plane (six <110> directions are found if reverse directions are distinguished). Hence, the orientation distribution with the regular pattern having the hexagonal fundamental unit shown in FIG. 3 will be formed if crystal grains are sequentially formed such that the crystal orientation thereof is rotated about the three <110> directions every predetermined angle.

In this embodiment, the above stress relaxation mechanism is developed by a large stress being applied to the tantalum film by the TiW film formed thereon. This mechanism will transform a β-tantalum film, a metastable structure, to an α-tantalum film having a regular orientation distribution, a more stable, stress-relaxed structure. Other metal films in which such a regular orientation distribution occurs include films of metals with a cubic crystal structure, for example, a tungsten film, a chromium film, and a molybdenum film.

As discussed above, the present invention is directed to regular orientation distribution films formed by the stress relaxation mechanism called cooperative grain boundary sliding.

EXAMPLE 1

In Example 1, a method for preparing a sample of a tantalum film and analysis results thereof will be described.

Evaluation Sample

FIGS. 6A to 6D illustrate a process for preparing an evaluation sample.

Figure 6A:
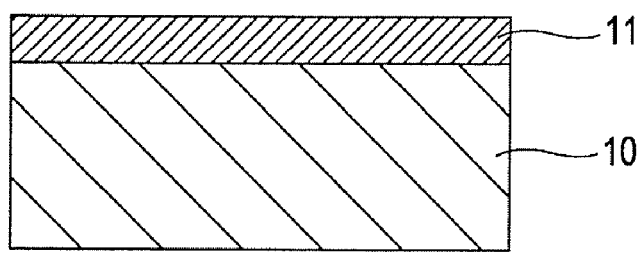
FIGS. 6A to 6D are diagrams illustrating a process for preparing a sample for evaluation by transmission electron microscopy (TEM).
Figure 6B:
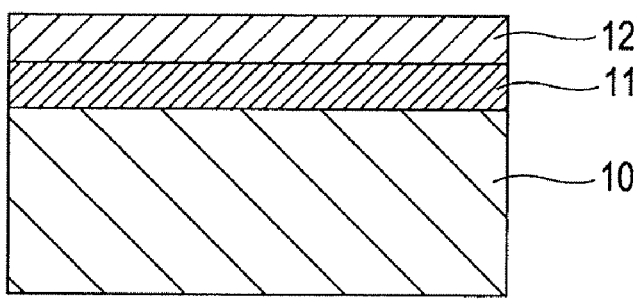

Referring to FIG. 6A, a silicon oxide film 11 with a thickness of about 1 µm was formed on a silicon substrate 10 by thermal oxidation. Referring to FIG. 6B, a tantalum film 12 with a thickness of 200 nm was formed by DC magnetron sputtering using tantalum as a target at a power output of 3 kW, a deposition pressure of 1.1 Pa, and an argon flow rate of 80 cm$^3$/min.

Figure 6C:
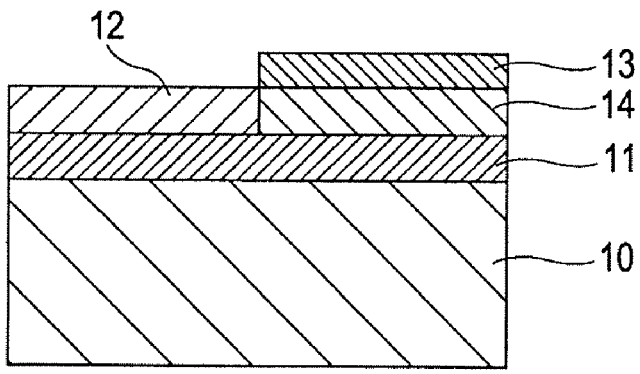

Referring to FIG. 6C, a TiW film 13 with a thickness of 200 nm was selectively formed on the tantalum film 12 by DC magnetron sputtering with a metal mask partially covering the tantalum film 12 using a TiW alloy (Ti:W=1:9) as a target at a power output of 2.7 kW, a deposition pressure of 1.1 Pa, an argon flow rate of 80 cm$^3$/min, a substrate temperature of 150° C., and a deposition rate of 11 nm/min.

Figure 6D:
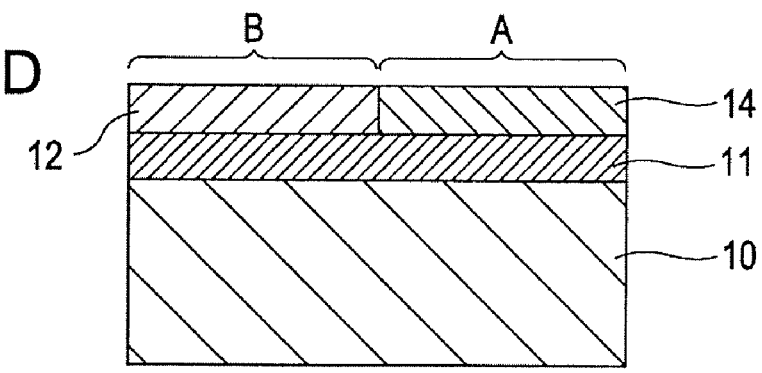

Referring to FIG. 6D, the TiW film 13 was removed by being dipped in a 30% hydrogen peroxide etchant heated to 45° C. for five minutes.

Analysis Results

Figure 7A:
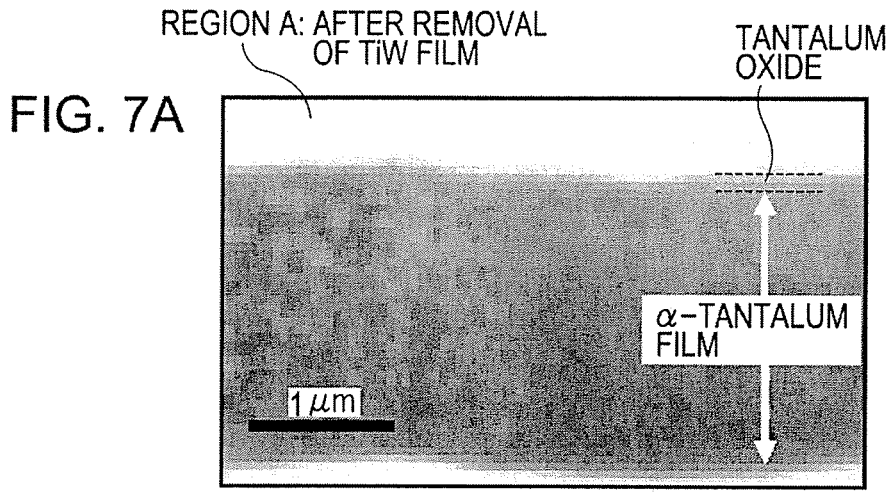
FIGS. 7A to 7C are photographs of cross-sectional TEM images and a selected-area diffraction image.
Figure 7B:
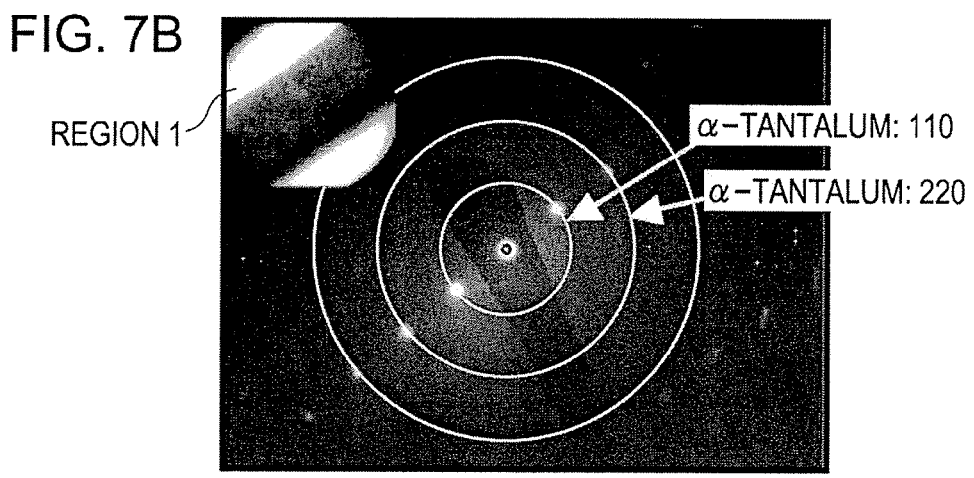
Figure 7C:
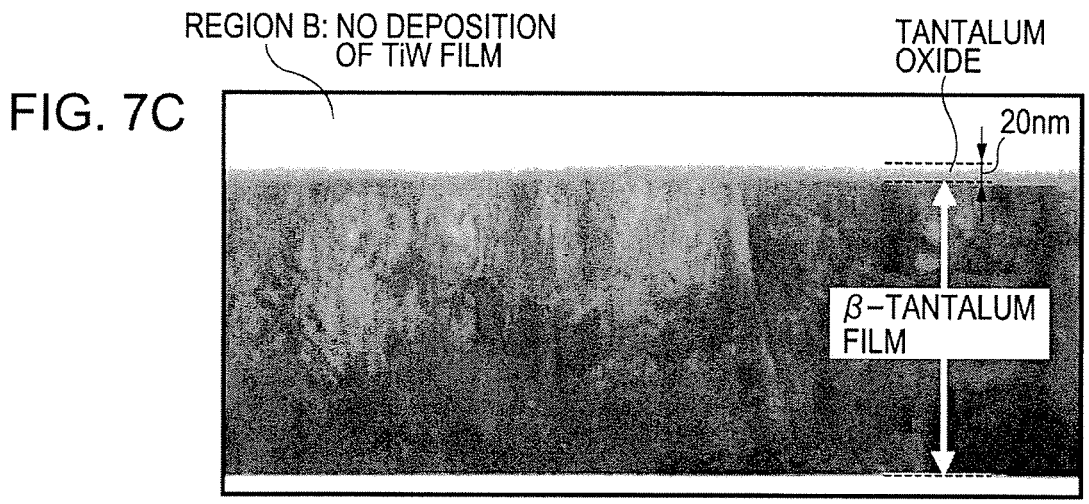

FIGS. 7A to 7C are cross-sectional transmission electron microscopy (TEM) observation images and a selected-area electron diffraction image of the evaluation sample.

The cross-sectional TEM observation (see FIG. 7A) and the selected-area electron diffraction (see FIG. 7B) proved that the film structure of a region A (see FIG. 6D) where the TiW film 13 was selectively formed was transformed to α-tantalum.

On the other hand, the film structure of a region B where the TiW film 13 was not formed was determined to be β-tantalum (see FIG. 7C).

Next, the region A of the sample under measurement was irradiated with an ion beam using a focused ion beam (FIB) system, and secondary electrons emitted from the surface of the sample were detected to obtain a scanning ion microscopy (SIM) image. Another SIM image was obtained after a surface oxide film was removed with an ion beam.

Figure 8A:
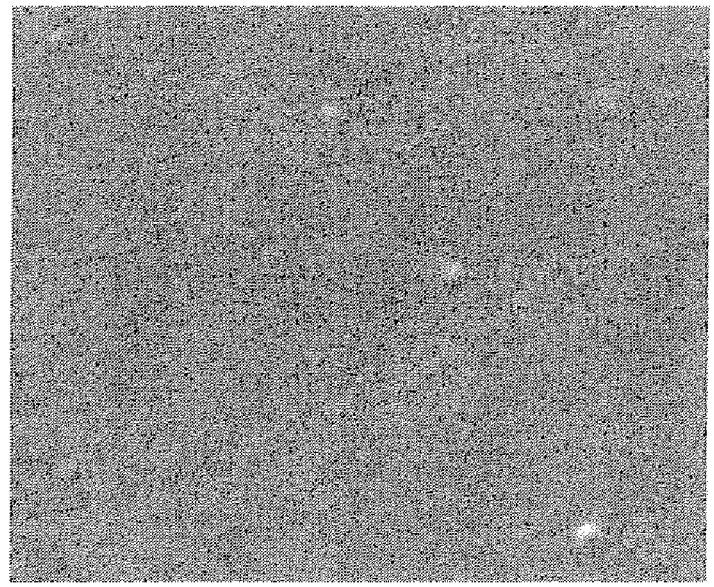
FIGS. 8A and 8B are photographs obtained by scanning ion microscopy (SIM).
Figure 8B:
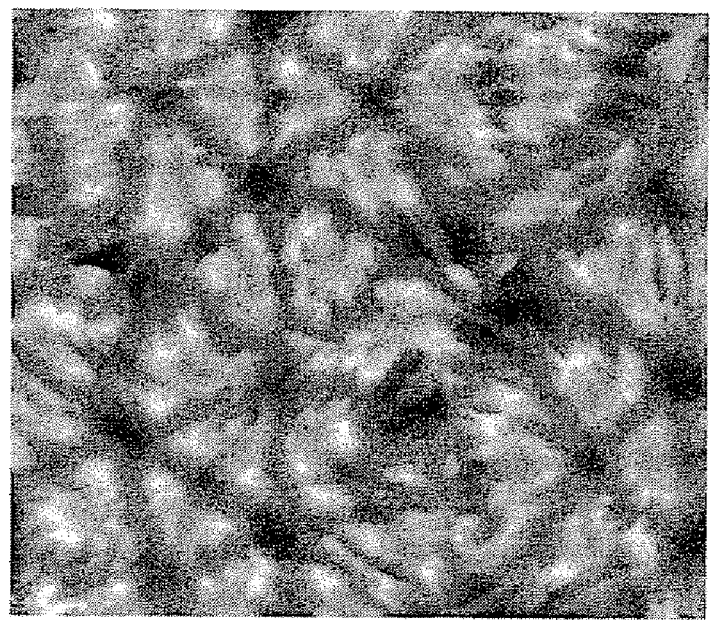

FIGS. 8A and 8B are the SIM images obtained before and after the removal of the surface oxide film, respectively. In the FIB system, the depth of penetration of irradiation ions depends on lattice planar density, which varies for different plane orientations of crystal grains (channeling effect). This results in variations in the yield of the secondary electrons, so that an image with contrast is developed. That is, the channeling contrast reveals the state of crystal orientation.

In FIG. 8B, a pattern of hexagons having vertices linked with black bands is found over the entire image. This pattern is continuously distributed in a plane. This image contrast shows that predetermined units are periodically distributed in a plane.

Next, the crystal orientation, which could not be identified only with the SIM image, was identified in terms of Miller indices using an electron backscattering pattern (EBSP).

An EBSP image is composed of intersecting Kikuchi bands. The width and intensity of the Kikuchi bands depend on crystal structure, typically lattice constant. In addition, the angles at which the Kikuchi bands intersect and the positions where they are developed are uniquely determined by crystal orientation. Hence, the crystal orientation of a sample can be identified by comparing the graphical features of an EBSP image obtained from the sample with simulation patterns of known crystal systems.

FIG. 9A shows an SIM image of a certain α-tantalum region, and FIG. 9B shows a gradation display of orientation determined from an EBSP image of the region.

These results demonstrated that the channeling contrast with the regular pattern observed in FIG. 8B was a reflection of the crystal orientation of α-tantalum. In addition, the black areas of the channeling contrast were determined to be the (001) plane, the (101) plane, and the (111) plane.

Figure 10A:
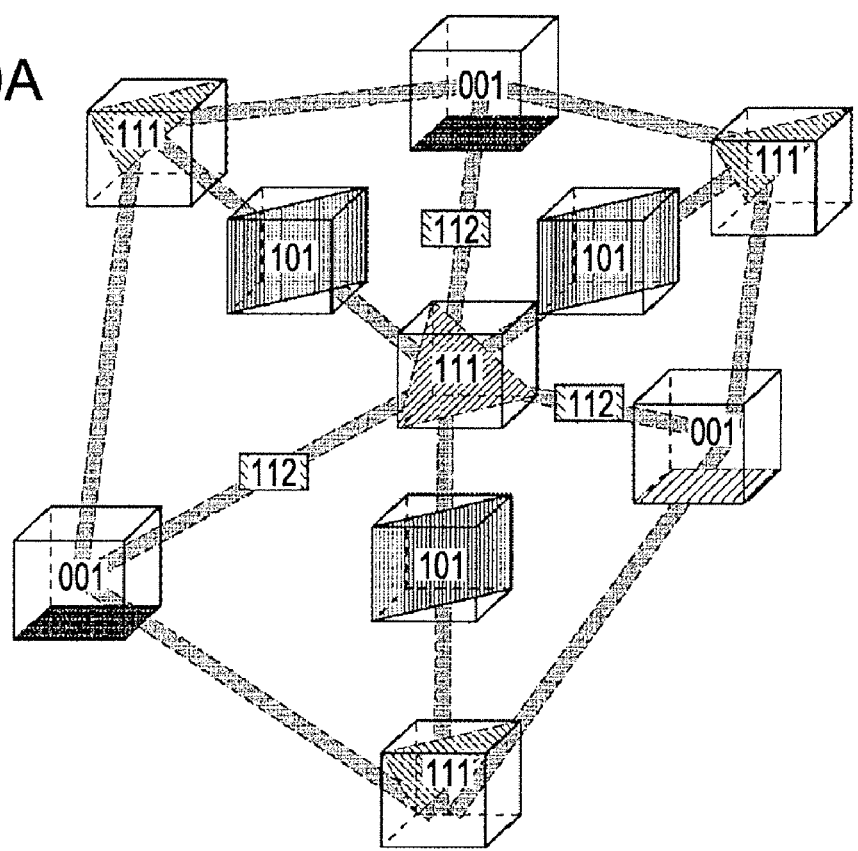
FIGS. 10A and 10B are schematic diagrams showing analysis results of an α-tantalum structure formed in an example of the present invention.
Figure 10B:
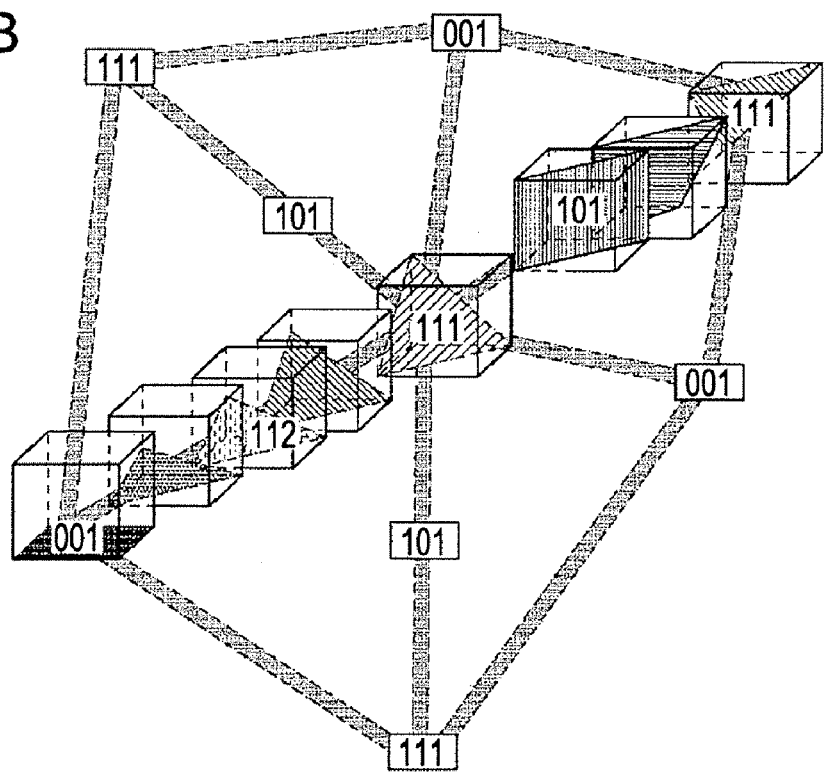

FIG. 10A schematically illustrates the results of the EBSP image, and FIG. 10B schematically illustrates the change of crystal orientation from the (001) plane to the (111) plane. These figures show that the tantalum film of this example had such an in-plane distribution that the crystal orientation thereof was gradually rotated about a particular crystal axis.

To date, there has been no report of such a film structure as far as the inventors know; this is a unique crystal form first discovered by the inventors. In addition, the metal film of this example was a high-quality thin film because no clear grain boundaries were seen in the EBSP results, at least under the condition of the present EBSP resolution.

EXAMPLE 2

Sample

A sample of Example 2 was prepared by forming a tantalum film on a silicon oxide film formed on a silicon substrate in the same manner as in Example 1, forming a TiW film on the tantalum film, and removing the TiW film therefrom by etching. Also, a sample of Comparative Example was prepared by forming a tantalum film on a silicon oxide film formed on a silicon substrate in the same manner as in Example 1.

Evaluation

Table 1 shows the results of experiments for heat resistance, oxidation resistance, mechanical strength, and electrical conductivity. The grades of these properties are represented by the symbols A, B, and C in descending order of grade. These results show that the regular orientation distribution α-tantalum film had higher film quality than the β-tantalum film.

It seems that an α-tantalum film with no regular orientation distribution has lower film quality than one with regular orientation distribution because of lower flatness and the presence of clear grain boundaries.

TABLE 1

|  | Heat resistance | Oxidation resistance | Mechanical strength | Electrical conductivity |
|---|---|---|---|---|
| Example 2 (regular orientation distribution α-tantalum film) | A | A | A | A |
| Comparative Example (β-tantalum film) | B | C | A | C |

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-219168 filed Aug. 11, 2006 and No. 2007-165231 filed Jun. 22, 2007, which are hereby incorporated by reference herein in their entirety.

What is claimed is:

1. A metal film having a cubic crystal structure, the metal film including a region orientated with respect to a crystal-axis direction, wherein an in-plane distribution of the region orientated with respect to the crystal-axis direction is such that {100}, {110}, and {111} planes appear in a periodic pattern.

2. The metal film according to claim 1, wherein the region orientated with respect to the crystal-axis direction extends over a length of 10 μm or more.

3. The metal film according to claim 1, wherein the metal film is a tantalum film, a tungsten film, a chromium film, or a molybdenum film.

4. The metal film according to claim 1, wherein the metal film is formed on a substrate.

5. The metal film according to claim 4, wherein the substrate includes silicon, silicon oxide, beryllium oxide, or aluminum oxide.

* * * * *